(12) United States Patent
Leung et al.

(10) Patent No.: US 8,445,329 B2
(45) Date of Patent: May 21, 2013

(54) CIRCUIT BOARD WITH OVAL MICRO VIA

(75) Inventors: Andrew K W Leung, Markham (CA); Neil McLellan, Toronto (CA)

(73) Assignee: ATI Technologies ULC, Markham (CA)

( * ) Notice: Subject to any disclaimer, the term of this patent is extended or adjusted under 35 U.S.C. 154(b) by 270 days.

(21) Appl. No.: 12/570,363

(22) Filed: Sep. 30, 2009

(65) Prior Publication Data

US 2011/0074041 A1 Mar. 31, 2011

(51) Int. Cl.
*H01L 21/00* (2006.01)
(52) U.S. Cl.
USPC 438/125; 438/667; 257/E21.49; 257/E21.511
(58) Field of Classification Search
USPC .................... 438/125, 667, 940; 257/E21.49, 257/E21.505, E21.511
See application file for complete search history.

(56) References Cited

U.S. PATENT DOCUMENTS

| | | | |
|---|---|---|---|
| 5,304,743 A | 4/1994 | Sen et al. | |
| 6,037,547 A * | 3/2000 | Blish, II | 174/264 |
| 6,522,014 B1 | 2/2003 | Egitto et al. | |
| 6,916,685 B2 | 7/2005 | Yang et al. | |
| 7,081,402 B2 | 7/2006 | Hsu et al. | |
| 7,271,028 B1 | 9/2007 | Pace | |
| 7,485,970 B2 | 2/2009 | Hsu et al. | |
| 2006/0138591 A1 | 6/2006 | Arney, Jr. | |
| 2008/0190658 A1* | 8/2008 | Toyoda et al. | 174/263 |
| 2008/0191345 A1 | 8/2008 | Na et al. | |
| 2010/0314778 A1* | 12/2010 | Murai et al. | 257/774 |

FOREIGN PATENT DOCUMENTS

| | | | |
|---|---|---|---|
| EP | 1 259 102 A1 | | 11/2002 |
| JP | 2002-64274 | * | 2/2002 |
| JP | 2002-64274 A | | 2/2002 |
| WO | WO9710614 | | 3/1997 |
| WO | WO2009101904 | * | 8/2009 |

OTHER PUBLICATIONS

Machine translation of JP 2002-64274.*
PCT/US2010/048049 International Search Report mailed Nov. 10, 2010.

* cited by examiner

*Primary Examiner* — Caridad Everhart
(74) *Attorney, Agent, or Firm* — Timothy M. Honeycutt (57) ABSTRACT

Various circuit boards and methods of manufacturing the same are disclosed. In one aspect, a method of manufacturing is provided that includes forming a first interconnect layer of a circuit board. The first interconnect layer includes a first conductor structure. A first via is formed in the first interconnect layer and in electrical contact with the first conductor structure. The first via has a first oval footprint.

19 Claims, 5 Drawing Sheets

CIRCUIT BOARD WITH OVAL MICRO VIA

BACKGROUND OF THE INVENTION

1. Field of the Invention

This invention relates generally to semiconductor processing, and more particularly to circuit boards with vias and to methods of making the same.

2. Description of the Related Art

Circuit boards of various types, including semiconductor chip package substrates and circuit cards, utilize conductor lines or traces to convey signals, power and ground from one point to another. Many conventional circuit board designs use multiple interconnect layers or levels. One layer is electrically linked to the next by way of conducting vias. The vias themselves are frequently formed on so-called via lands, which are shaped pads of conducting material. Many conventional circuit board vias typically have a circular footprint. One type of conventional via pad has a circular footprint and another type uses a rectangular footprint.

There is an on-going trend to squeeze more routing into circuit boards, particularly semiconductor chip package substrates. The need for greater routing complexity is caused by, among other things, increases in the number of input/outputs of ever more complex semiconductor die designs. It is not a trivial matter to insert more traces and vias into a circuit board layout. Indeed, the goal of increased routing must compete with design rules, which are put in place to ensure that manufacturing processes used to form the circuit board can do so reliably.

Rectangular via lands or even conventional landless designs can provide some increase in packing density. However, any attempt to shrink a via size to accommodate additional trace routing needs to account for attendant increase in current densities in the via and the via land. If current densities exceed threshold levels, device failure can occur. For example, some conventional small circular vias and lands can have current density issues. Many conventional designs try to avoid the issue by essentially over designing the via hold laser drilling process. Holes are laser drilled with generous sizes. However, the large via hole sizes tend to prevent the placement of traces adjacent the vias in order to satisfy design rules.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes forming a first interconnect layer of a circuit board. The first interconnect layer includes a first conductor structure. A first via is formed in the first interconnect layer and in electrical contact with the first conductor structure. The first via has a first oval footprint.

In accordance with another aspect of an embodiment of the present invention, a method of conveying current in a circuit board is provided that includes electrically coupling a first conductor structure to a first via in a first interconnect layer of the circuit board. The first via has a first oval footprint. A first current is conveyed through the first via.

In accordance with another aspect of an embodiment of the present invention, a circuit board is provided that includes a first interconnect layer that has a first conductor structure. A first via is coupled to the first conductor structure and has a first oval footprint.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various embodiments of a printed circuit board, such as a semiconductor chip package carrier substrate, are described herein. One example includes multiple interconnect layers with at least one that has a via provided with an oval footprint that facilitates trace routing. Additional details will now be described.

Figure 1:
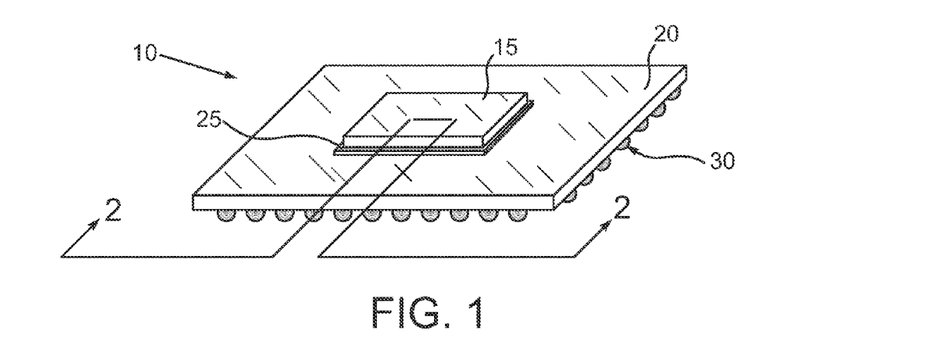
FIG. 1 is a pictorial view of an exemplary embodiment of a semiconductor chip device that includes a semiconductor chip mounted on a circuit board.

In the drawings described below, reference numerals are generally repeated where identical elements appear in more than one figure. Turning now to the drawings, and in particular to FIG. 1, therein is shown a pictorial view of an exemplary embodiment of a semiconductor chip device 10 that includes a semiconductor chip 15 mounted on a circuit board 20. An underfill material layer 25 is positioned between the semiconductor chip 15 and the circuit board 20. The semiconductor chip 15 may be any of a myriad of different types of circuit devices used in electronics, such as, for example, microprocessors, graphics processors, combined microprocessor/graphics processors, application specific integrated circuits, memory devices or the like, and may be single or multi-core or even stacked with additional dice. The semiconductor chip 15 may be constructed of bulk semiconductor, such as silicon or germanium, or semiconductor on insulator materials, such as silicon-on-insulator materials. The semiconductor chip 15 may be flip-chip mounted to the circuit board 20 and electrically connected thereto by solder joints or other structures (not visible in FIG. 1 but shown in subsequent figures).

The circuit board 20 may be a semiconductor chip package substrate, a circuit card, or virtually any other type of printed circuit board. Although a monolithic structure could be used for the circuit board 20, a more typical configuration will utilize a build-up design. In this regard, the circuit board 20 may consist of a central core upon which one or more build-up layers are formed and below which an additional one or more build-up layers are formed. The core itself may consist of a stack of one or more layers. One example of such an arrangement may be termed a so called "2-2-2" arrangement where a single-layer core is laminated between two sets of two build-up layers. If implemented as a semiconductor chip package substrate, the number of layers in the circuit board 20 can vary from four to sixteen or more, although less than four may be used. So-called "coreless" designs may be used as well. The layers of the circuit board 20 may consist of an insulating material, such as various well-known epoxies, interspersed with metal interconnects. A multi-layer configuration other than build-up could be used. Optionally, the circuit board 20 may be composed of well-known ceramics or other materials suitable for package substrates or other printed circuit boards.

The circuit board 20 is provided with a number of conductor traces and vias and other structures in order to provide power, ground and signals transfers between the semiconductor chip 15 and another circuit device that is not shown. To facilitate those transfers, the circuit board 20 may be provided with input/outputs in the form of a pin grid array, a ball grid array, a land grid array or other type of interconnect scheme. In this illustrative embodiment, the circuit board 20 is provided with a ball grid array consisting of plural solder balls 30.

Figure 2:
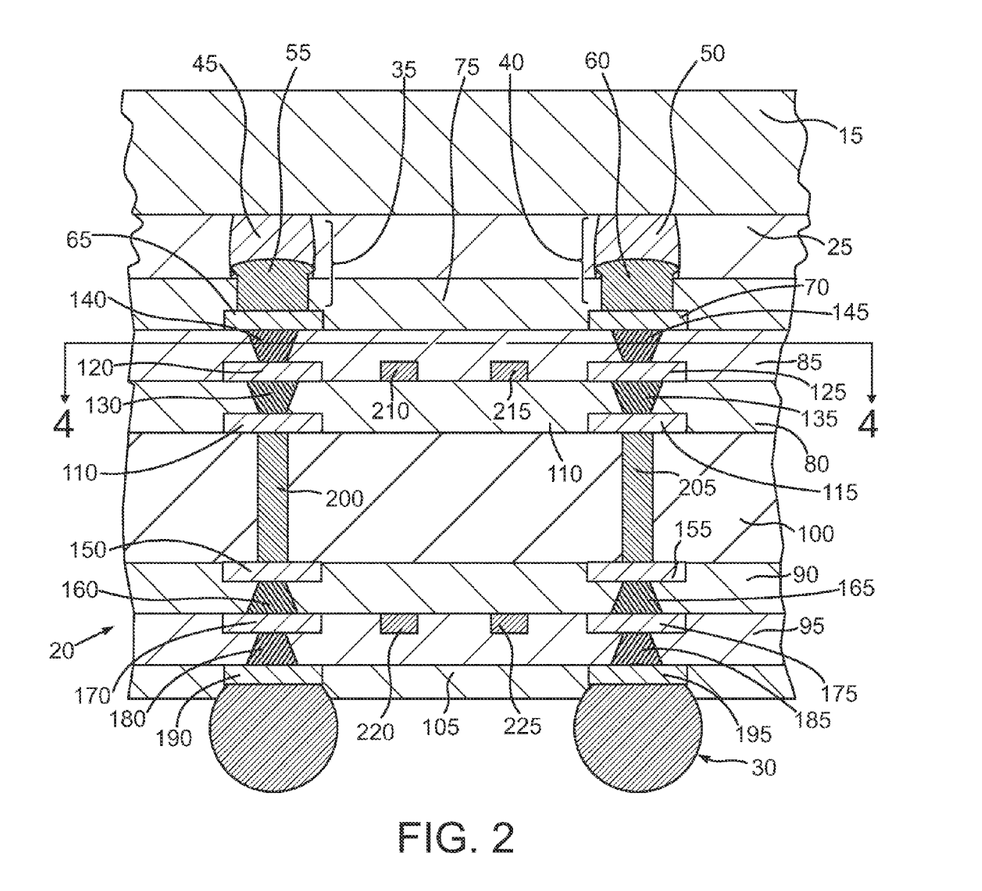
FIG. 2 is a sectional view of FIG. 1 taken at section 2-2.

Attention is now turned to FIG. 2, which is a sectional view of FIG. 1 taken at section 2-2. Note that section 2-2 only encompasses a rather small portion of the semiconductor chip 15 and the circuit board 20. As shown, the semiconductor chip 15 may be flip-chip mounted to the circuit board 20 and electrically connected thereto by way of plural solder joints 35 and 40. While only two solder joints 35 and 40 are depicted, there may be scores, hundreds or even thousands of such joints depending upon the size of complexity of the semiconductor chip 15 and the circuit board 20. The solder joints 35 and 40 may consist of respective solder bumps 45 and 50 that are coupled to the semiconductor chip 15 and presolders 55 and 60 that are metallurgically bonded to respective conductor pads 65 and 70 of the circuit board 20. The solder bumps 45 and 50 are metallurgically coupled to the presolders 55 and 60 by way of a reflow process. The solder bumps 45 and 50, and solder balls 30 may be composed of various lead-based or lead-free solders. An exemplary lead-based solder may have a composition at or near eutectic proportions, such as about 63% Sn and 37% Pb. Lead-free examples include tin-silver (about 97.3% Sn 2.7% Ag), tin-copper (about 99% Sn 1% Cu), tin-silver-copper (about 96.5% Sn 3% Ag 0.5% Cu) or the like. The presolder 65 may be composed of the same types of materials. Optionally, the presolder 65 may be eliminated in favor of a single solder structure or a solder plus a conducting post arrangement. A portion of the underfill material layer 25 is visible and dispersed between the semiconductor chip 15 and the circuit board 20 to reduce the effects of differences in the coefficients of thermal expansion (CTE) of the semiconductor chip 15, the solder joints 35 and 40 and the circuit board 20. The underfill material layer 25 may be, for example, an epoxy resin mixed with silica fillers and phenol resins, and deposited before or after the re-flow process to establish the solder joints 35 and 40. The presolders 55 and 60 and the conductor pads 65 and 70 are surrounded laterally by a solder mask 75 that is lithographically patterned to form plural openings in order to accommodate the various presolders, for example, the presolders 55 and 60. The solder mask 75 may be fabricated from a variety of suitable materials for solder mask fabrication, such as, for example, PSR-4000 AUS703 manufactured by Taiyo Ink Mfg. Co., Ltd. or SR7000 manufactured by Hitachi Chemical Co., Ltd.

In this illustrative embodiment, the circuit board 20 is implemented as a semiconductor chip package substrate that is of a 2-2-2 build-up design. In this regard, interconnect or build-up layers 80 and 85 and 90 and 95 are formed on opposite sides of a core 100. The core 100 may be monolithic or a laminate or two or more layers as desired. The core 100 and the build-up layers 80, 85, 90 and 95 may be composed of well-known polymeric materials, such as, GX13 supplied by Ajinomoto, Ltd. The build-up layers 80, 85, 90 and 95, the core 100, the solder mask 75 and another solder mask 105 formed on the build-up layer 95 make up an interconnect system for the circuit board 20. The following discussion of the various conductor structures in FIG. 2 will be illustrative of other conductor structures in the circuit board 20. The build-up layer 80 may include respective conductor structures or pads 110 and 115 that are interconnected with another set of conductor structures or pads 120 and 125 in the build-up layer 85 by way of respective vias 130 and 135 formed in the build-up layer 80. Similarly, the conductor pads 120 and 125 in the build-up layer 85 may be electrically connected to the overlying conductor pads 65 and 70 in the solder mask 75 by way of respective vias 140 and 145. Electrical pathways through the build-up layers 90 and 95 and the solder mask 105 may be similarly provided by way of conductor pads 150 and 155 and vias 160 and 165 in the build-up layer 90, conductor pads 170 and 175 and corresponding vias 180 and 185 in the build-up layer 85 and ball pads 190 and 195 in the solder mask 105 that are connected to the vias 180 and 185. The solder balls 30 are metallurgically bonded to the ball pads 190 and 195. Electrical pathways through the core 100 may be provided by way of thru-vias 200 and 205, which may be plated thru holes or other types of conductors. An exemplary pair of conductor traces 210 and 215 are positioned between the pads 120 and 125 in the build-up layer 85. As described more fully below, the advantageous footprints of the conductor pads 120 and 125 enable the traces 210 and 215 to be routed therebetween to provide a more complex and flexible routing of power, ground and/or signals in the circuit board 20 than might otherwise be possible using conventional designs where design rules and conventional pad footprints might prevent the nesting of such traces. The same is true with regard to the build-up layer 95 in that there may be one or more traces 220 and 225 placed between the pads 170 and 175 to provide for more complex routing. The various conductors of the interconnect layers of the circuit board 20 may be used to convey currents in the circuit board 20 and between the semiconductor chip 15 and the circuit board 20.

Figure 3:
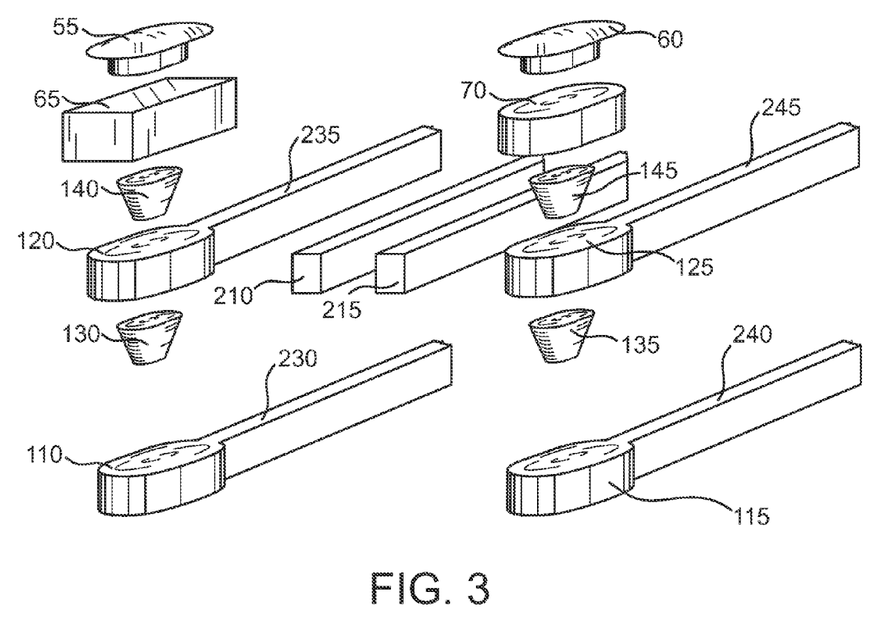
FIG. 3 is an exploded pictorial view of some of the interconnect components depicted in FIG. 2.

Additional details of the interconnect system of the circuit board and in particular the vias 140 and 145 may be understood by referring now to FIG. 3, which is an exploded pictorial view of the conductor pad 110, the via 130, the conductor pad 120, the via 140, the conductor pad 65 and the presolder 55, the two traces 210 and 215 and the conductor pad 115, the via 135, the conductor pad 125, the via 145, the conductor pad 70 and the presolder 60. Note that the conductor pads 110, 120, 115 and 125 may be interconnected to other circuit structures by way of traces 230, 235, 240 and 245 respectively. Note also that only a portion of the lengths of the traces 230, 235, 240 and 245 are depicted. Similarly, only a portion of the traces 210 and 215 are shown for simplicity of illustration. It should be understood that FIG. 3 depicts the foregoing features without any of the surrounding insulating material layers that are shown in FIG. 2. As noted briefly above, the footprints of the vias 140 and 145 may be tailored to enable the nesting of one or more traces 210 and 215 therebetween. In this illustrative embodiment, the vias 140 and 145 may be provided with generally oval footprints that taper down as shown. The corresponding pads 120 and 125 may also be provided with generally oval footprints as shown. If desired, the pads 110 and 115 and 65 and 70 may also be provided with oval footprints although rectangular, square or other shapes may also be used. For example, the pad 65 is depicted with a rectangular footprint. Indeed, even the pre-solders 55 and 60 may be provided with generally oval footprints if desired.

Figure 4:
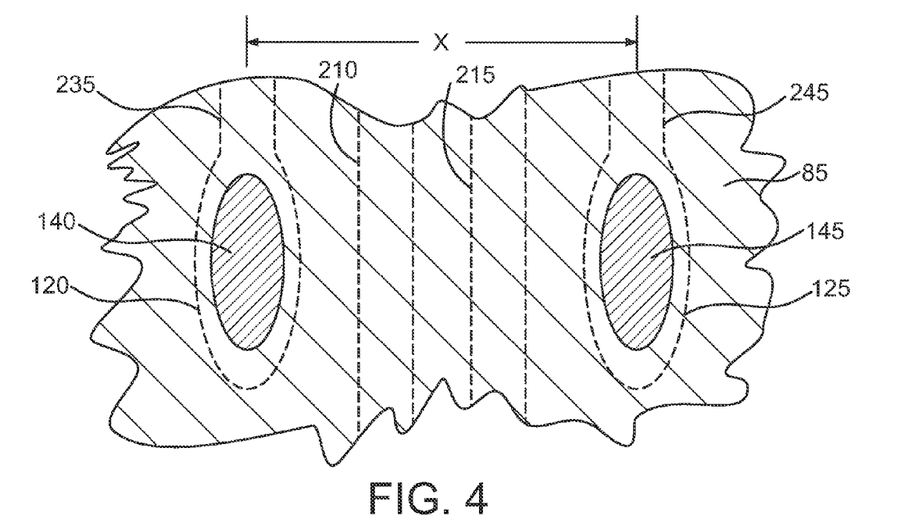
FIG. 4 is a sectional view of FIG. 2 taken at section 4-4.

Attention is now turned to FIG. 4, which is a sectional view of FIG. 2 taken at section 4-4. Note that because of the location of section 4-4, the vias 140 and 145 appear in section but the underlying pads 120 and 125 and their respective traces 235 and 245, and the nested traces 210 and 215 are shown in phantom. The oval footprints of the vias 140 and 145 provide at least two benefits. First, the oval footprints enable the pitch X between the vias 140 and 145 to be relatively small while still accommodating space for the nested traces 210 and 215. This accommodation of the nested traces 210 and 215 may not be possible if, for example, both the vias 140 and 145 and the underlying lands 120 and 125 were of conventional octagonal, round or even rectangular shape where any corners thereof in proximity to nested traces could violate design rules. Second, the oval footprints enable the vias 140 and 145 to have sufficient volumes to keep current densities below acceptable limits. Since the vias 140 and 145 are designed to convey currents in the circuit board 20 and between the circuit board 20 and the semiconductor chip 15, current densities should be kept low enough to avoid device failure. It should be understood that the vias in the circuit board 20, such as the vias 140 and 145, could have the same or different footprints. For example, each could have an oval footprint, but of different sizes. Optionally, some could be oval and others a different shape. The same is true for the conductor pads 120, 125 or any of the other conductor pads disclosed herein.

Figure 5:
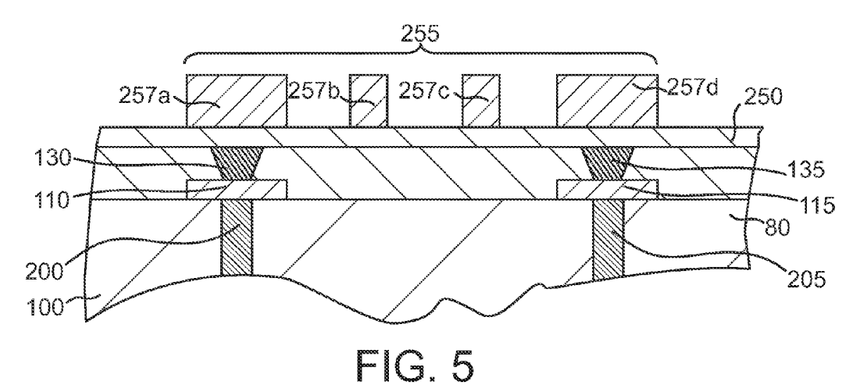
FIG. 5 is a sectional view like FIG. 2, but depicting initial processing to establish various conductor pads and traces.
Figure 6:
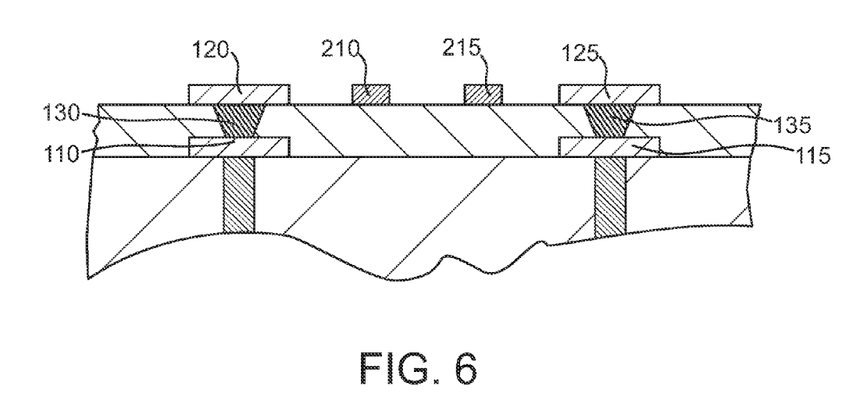
FIG. 6 is a sectional view like FIG. 5, but depicting the fabricated conductor pads and traces.

An exemplary method for fabricating the vias 140 and 145 and other structures of the interconnect scheme may be understood by referring now to FIGS. 5, 6, 7 and 8 and initially to FIG. 5. FIG. 5 is a sectional view like FIG. 2, but for simplicity of illustration only depicts an upper portion of the core 100 and the thru-vias 200 and 205. In addition, the overlying semiconductor chip 15 depicted in FIGS. 1 and 2 is not attached at this point and thus not depicted. The build-up layer 80 including the conductor pads 110 and 115 and the vias 130 and 135 have already been constructed. At this point, a conductor layer 250 may be applied to the build-up layer 80. Through subsequent processing, the conductor layer 250 will be transformed into pairs of conductor pads and signal traces as described in more detail below. The conductor layer 250 may be fabricated from a variety of conductor materials, such as aluminum, copper, silver, gold, titanium, refractory metals, refractory metal compounds, alloys of these or the like. In lieu of a unitary structure, the conductor layer 250 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the conductor layer 250. Various well-known techniques for applying metallic materials may be used, such as physical vapor deposition, chemical vapor deposition, plating or the like. In an exemplary embodiment, the conductor layer 250 may be composed of copper and deposited by well-known plating processes.

At this stage, a mask 255 may be formed on the conductor layer 250 and patterned lithographically into plural portions 257a, 257b, 257c and 257d. The portions 257a, 257b, 257c and 257d are patterned to have the desired footprints of the later formed conductor structures. For example, if the conductor pads 120 and 125 are slated to have oval footprints, then the mask portions 257b and 257c are lithographically patterned as ovals. It may be necessary, depending upon the limitations associated with the lithographic patterning of the mask 255, to approximate a pure oval shape by way of a series of interconnecting polygons, which are generally more readily available for lithography processing than strictly curved shapes. Following the formation of the mask 255, the conductor layer 250 is subjected to an etch process to remove those exposed portions of the conductor layer 250. Following the etch process, the mask 255 may be removed by ashing, solvent stripping or combinations of the two. Following the removal of the mask 255 shown in FIG. 5, the conductor pads 120 and 125 as well as the traces 210 and 215 remain.

Figure 7:
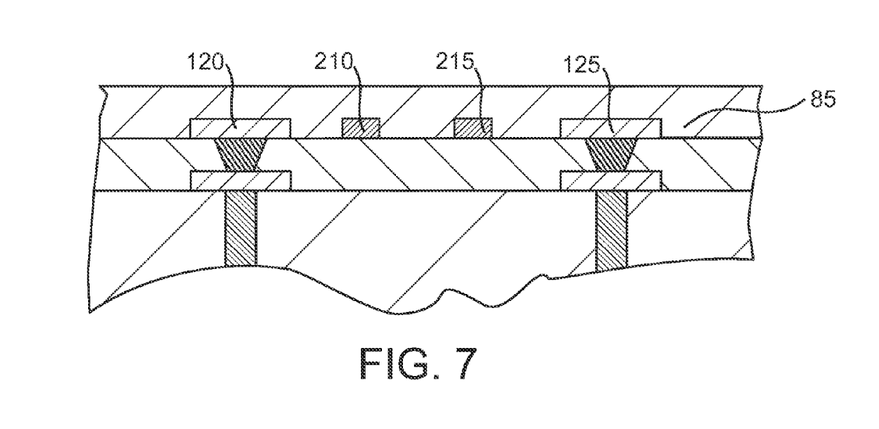
FIG. 7 is a sectional view like FIG. 6, but depicting formation of a build-up layer.

Following the patterning of the pads 120 and 125 and the traces 210 and 215, the build-up layer 85 may be formed. As shown in FIG. 7, an insulating material of the type(s) described elsewhere herein may be deposited by spin coating or other techniques and cured by heating or otherwise. The build-up layer 85 covers the pads 120 and 125 and the traces 210 and 215.

Figure 8:
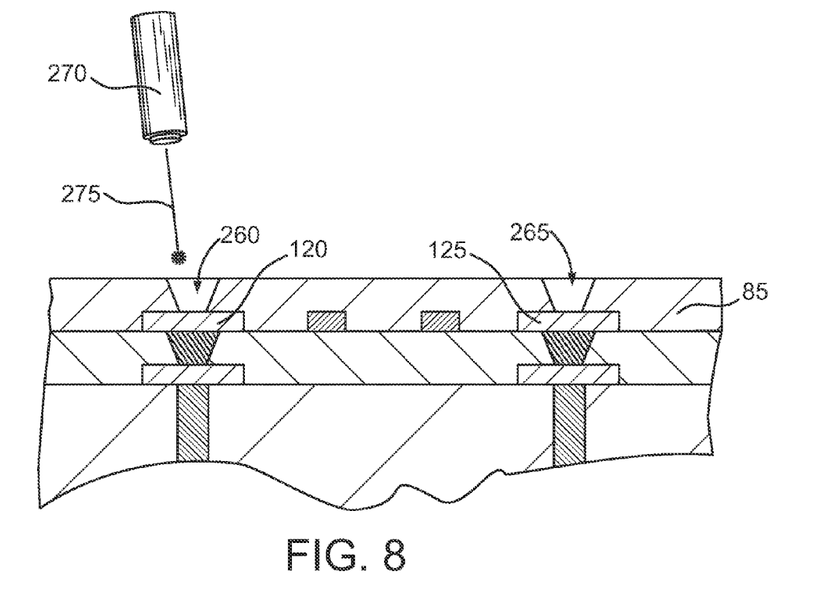
FIG. 8 is a sectional view like FIG. 7, but depicting laser drilling of via openings in the build-up layer.

The process of forming openings in the build-up layer 85 to accommodate the subsequently formed vias will be described now in conjunction with FIG. 8. In an exemplary embodiment, the openings 260 and 265 may be formed over the conductor pads 120 and 125 by laser cutting. A laser 270 may deliver the laser radiation 275 in pulses or as a continuous beam. The wavelength and spot size of the laser radiation 275 are selected to effectively ablate the build-up layer material layer 85 while producing the openings 260 and 265 with desired sizes and footprints. For example, radiation 275 in the ultraviolet range and with a spot size in the 2 to 5 micron range could be used. Note that the laser 270 may be tilted off axis to provide a sloped profile for the openings 260 and 265 as desired. It is necessary for the openings 260 and 265 to be drilled completely to the underlying pads 120 and 125, but some care should be exercised to ensure that the cutting process does not remove excessive material from the pads 120 and 125.

Figure 9:
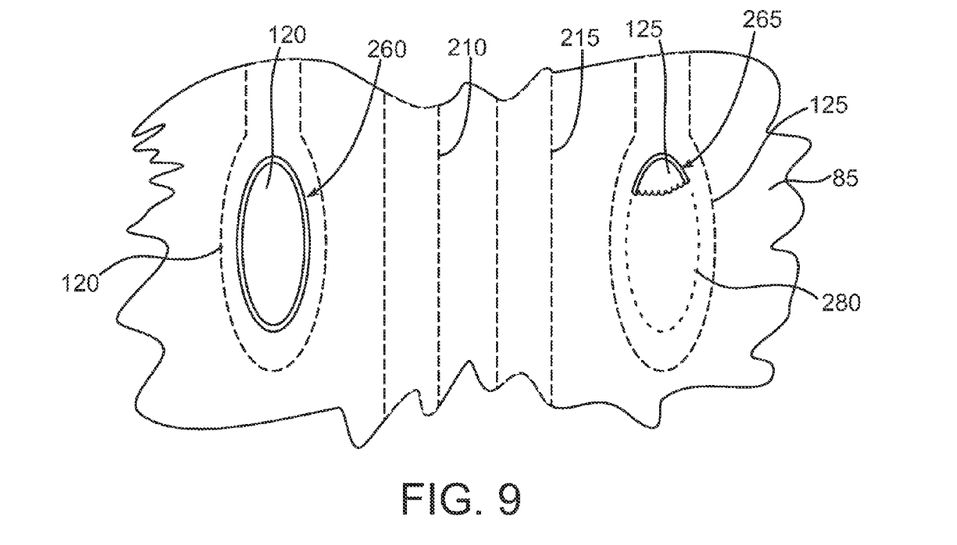
FIG. 9 is an overhead view of the laser drilling process.

An overhead view of the cutting process is depicted in FIG. 9. FIG. 9 depicts the laser cutting process at a stage where the opening 260 is fully formed and the opening 265 has been partially formed. Note that a portion of the conductor pad 120 positioned beneath the opening 260 is exposed but the remainder is covered and thus shown in phantom. A fraction of the conductor pad 125 has been exposed but the remainder is covered and thus shown in phantom. The conductor traces 210 and 215 are similarly shown in phantom. The dashed partial oval 280 represents the desired footprint for the remainder of the opening 265. Because the laser spot size will typically be quite a bit smaller than the size of the opening 265, the laser 270 cuts the build-up material 85 in a pattern, such as a raster pattern. The positioning of the laser beam 275 may be tightly controlled. Accordingly, the angular orientations of the openings 260 and 265 need not be aligned with the principal axes of the semiconductor chip 15 (see FIG. 1), but could be oriented in virtually any direction.

In another exemplary embodiment, the openings may be formed by lithographic patterning and etching. If an inwardly sloping profile is desired for the openings 260 and 265, then a dry etch may be performed with a first anisotropic stage followed by one or more isotropic stages. The appropriate etch chemistry will depend on the composition of the build-up layer 85.

Figure 10:
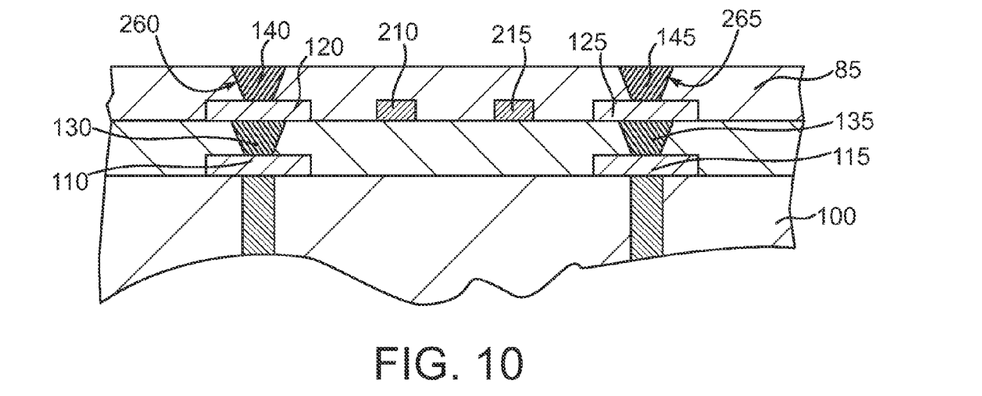
FIG. 10 is a sectional view like FIG. 8, but depicting exemplary via formation.

Following the formation of the openings 260 and 265, the vias 140 and 145 may be formed therein. The vias 140 and 145 may be composed of a variety of conductor materials, such as aluminum, copper, silver, gold, titanium, refractory metals, refractory metal compounds, alloys of these or the like. In lieu of a unitary structure, the vias 140 and 145 may consist of a laminate of plural metal layers, such as a titanium layer followed by a nickel-vanadium layer followed by a copper layer. In another embodiment, a titanium layer may be covered with a copper layer followed by a top coating of nickel. However, the skilled artisan will appreciate that a great variety of conducting materials may be used for the vias 140 and 145. Various well-known techniques for applying metallic materials may be used, such as physical vapor deposition, chemical vapor deposition, plating or the like. In an exemplary embodiment, the vias may be formed by copper plating performed in two stages. The first stage involves the application of a relatively thin layer of copper in the openings 260 and 265. In a second stage a bulk plating process is performed to fill in the vias 140 and 145.

The processes described herein for establishing the build-up layer 85, including the conductor pads 120 and 125, the traces 210 and 215 and the vias 140 and 145, may also be used to establish the build-up layer 80 including the conductor pads 110 and 115 and the vias 130 and 135 thereof. The same is true for any of the other layers on the opposite side of the core 100.

Figure 11:
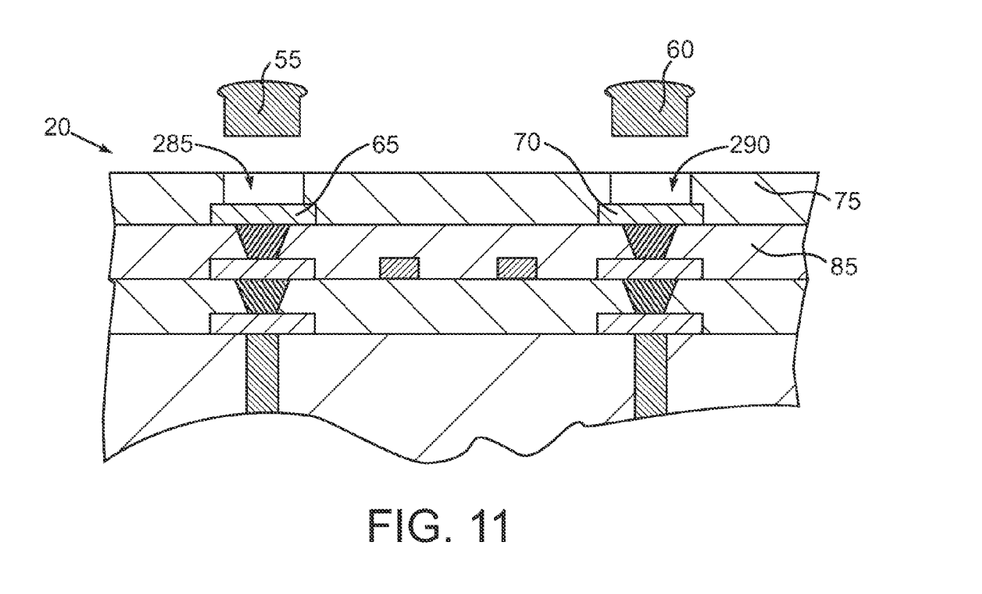
FIG. 11 is a sectional view like FIG. 10, but depicting presolder attachment.

Referring now to FIG. 11, the build-up layer consisting of the solder mask 75 and the conductor pads 65 and 70 may be formed on the build-up layer 85 by well-known material deposition and patterning techniques. For example, the conductor pads 65 and 70 may be fabricated using the same general conductor deposition and patterning techniques used to form the conductor pads 110 and 115 and 120 and 125 as described elsewhere herein. The solder mask 75 may be deposited using well-known solder mask deposition techniques, such as spin coating or other deposition techniques as desired. Suitable openings 285 and 290 may be formed in the solder mask 75 by well-known lithographic patterning and etch techniques. The openings 285 and 290 are advantageously positioned over the conductor pads 65 and 70. At this point, the presolders 55 and 60 may be positioned in the openings 285 and 290 and coined as shown. A reflow may be performed at this point to bond the presolders 55 and 60 to the underlying conductor pads 65 and 70. Following the application of the presolders 55 and 60, the semiconductor chip 15 depicted in FIGS. 1 and 2 may be mounted to the presolders 55 and 60 and a reflow process performed in order to create the solder joints 35 and 40 depicted in FIG. 2.

It should be understood that the processes described herein could be performed on a discrete circuit board or en masse on a strip or other aggregation of circuit boards. If done on en masse, the individual circuit boards may be singulated at some stage by sawing or other techniques.

Any of the exemplary embodiments disclosed herein may be embodied in instructions disposed in a computer readable medium, such as, for example, semiconductor, magnetic disk, optical disk or other storage medium or as a computer data signal. The instructions or software may be capable of synthesizing and/or simulating the circuit structures disclosed herein. In an exemplary embodiment, an electronic design automation program, such as Cadence APD, Encore or the like, may be used to synthesize the disclosed circuit structures. The resulting code may be used to fabricate the disclosed circuit structures.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
    forming a first interconnect layer of a circuit board, the first interconnect layer including a first via land; and
    forming a first via in the first interconnect layer prior to formation of a conductor structure over the first via land, the first via being in electrical contact with the first via land and having a first oval footprint, the first via land having a second oval footprint.

2. The method of claim 1, wherein the forming the first via comprises laser drilling an opening having the first oval footprint in the first interconnect layer.

3. The method of claim 1, comprising coupling a semiconductor chip to the circuit board.

4. The method of claim 1, comprising forming the first via using instructions stored in a computer readable medium.

5. The method of claim 1, comprising forming the first interconnect layer with a second via land and a second via coupled to the second via land, the second via having a third oval footprint.

6. The method of claim 5, comprising forming a conductor trace between the first and second vias.

7. The method of claim 5, wherein the first and third oval footprints are substantially the same.

8. The method of claim 5, the second via land is formed with a fourth oval footprint.

9. A circuit board, comprising:
    a first interconnect layer including a first via land having a first oval footprint;
    a first via coupled to the first via land and having a second oval footprint;
    a second coupled to the first via, the second conductor structure having a first surface in contact with the first via and a second and opposite surface; and
    wherein the first via does not project through the second conductor structure to the second surface.

10. The circuit board of claim 9, wherein the first interconnect layer comprises a build-up layer.

11. The circuit board of claim 9, comprising a semiconductor chip coupled to the circuit board.

12. The circuit board of claim 9, wherein the first interconnect layer includes a second via land having a third oval footprint and a second via coupled to the second via land, the second via having a fourth oval footprint.

13. The circuit board of claim 12, comprising a conductor trace positioned between the first and second vias.

14. The circuit board of claim 12, wherein the second and fourth oval footprints are substantially the same.

15. A method of manufacturing, comprising:
    forming a first build up layer of a circuit board, the first build up layer including a first via land having a first oval footprint;
    forming a first opening having a second oval footprint in the first interconnect layer and extending to the first via land;
    forming a first via in the first opening and in electrical contact with the first via land; and
    following formation of the first opening, forming a second conductor structure over the first via land.

16. The method of claim 15, comprising forming the first opening by laser drilling.

17. The method of claim 15, comprising forming the first interconnect layer with a second via land and a second via coupled to the second via land, the second via having a third oval footprint.

18. The method of claim 17, comprising forming a conductor trace between the first and second vias.

19. The method of claim 17, wherein the second and third oval footprints are substantially the same.

* * * * *